US010559489B2

(12) United States Patent
Son et al.

(10) Patent No.: US 10,559,489 B2
(45) Date of Patent: Feb. 11, 2020

(54) APPARATUS FOR MANUFACTURING A DISPLAY DEVICE AND A MANUFACTURING METHOD THEREOF

(71) Applicant: SAMSUNG DISPLAY CO., LTD., Yongin-si, Gyeonggi-do (KR)

(72) Inventors: Yang Han Son, Cheonan-si (KR); Jun Ho Kwack, Chungcheongnam-do (KR); Se Hun Park, Cheonan-si (KR); Young Kuil Joo, Asan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 162 days.

(21) Appl. No.: 15/455,673

(22) Filed: Mar. 10, 2017

(65) Prior Publication Data
US 2017/0263492 A1    Sep. 14, 2017

(30) Foreign Application Priority Data
Mar. 10, 2016  (KR) .................. 10-2016-0028950

(51) Int. Cl.
*H01L 21/687*  (2006.01)
*H01L 21/67*  (2006.01)
*H01L 27/12*  (2006.01)

(52) U.S. Cl.
CPC .. *H01L 21/68721* (2013.01); *H01L 21/67092* (2013.01); *H01L 27/1262* (2013.01)

(58) Field of Classification Search
None
See application file for complete search history.

(56) References Cited

U.S. PATENT DOCUMENTS

2014/0002975 A1 * 1/2014 Lee .................. H05K 5/0017
                                                                361/679.01
2014/0299269 A1   10/2014 Son et al.

FOREIGN PATENT DOCUMENTS

| CN | 104097383       | 10/2014 |
| KR | 10-2014-0120568 | 10/2014 |
| KR | 10-2015-0048547 | 5/2015  |
| KR | 10-2015-0053084 | 5/2015  |
| KR | 10-2015-0077829 | 7/2015  |

* cited by examiner

*Primary Examiner* — Barbara J Musser
(74) *Attorney, Agent, or Firm* — F. Chau & Associates, LLC

(57) ABSTRACT

An apparatus for manufacturing a display device includes a first jig including a first side, the first side having a concave groove for receiving a cover window, wherein the cover window includes a first planar portion, a first curved portion and a second curved portion, wherein the first and second curved portions are disposed at opposite ends of the first planar portion in a first direction, a second jig including a planar side for receiving a display panel, wherein when the second jig is moved in a second direction crossing the first direction with the display panel on the planar side, the display panel is disposed between the first and second curved portions of the cover window, and a pair of third jigs for supporting the first and second curved portions of the cover window.

9 Claims, 19 Drawing Sheets

APPARATUS FOR MANUFACTURING A DISPLAY DEVICE AND A MANUFACTURING METHOD THEREOF

CROSS-REFERENCE TO RELATED APPLICATION

This application claims priority under 35 U.S.C. § 119 to Korean Patent Application No. 10-2016-0028950, filed in the Korean Intellectual Property Office on Mar. 10, 2016, the disclosure of which is incorporated by reference herein in its entirety.

TECHNICAL FIELD

The present invention relates to an apparatus for manufacturing a display device, and more particularly, to an apparatus for manufacturing a display device and a manufacturing method thereof.

DISCUSSION OF THE RELATED ART

A flexible display device may include a flexible substrate that is light, has a good resistance against an impact, and is made of a plastic material. Since a flexible display device may be folded or rolled, it may be portable and utilized in various fields.

A flexible display device may include display elements formed on the flexible substrate. Examples of the display elements which may be used in a flexible display device include an organic light emitting diode display element and a liquid crystal display element.

The display elements described above generally include a thin film transistor. Therefore, the flexible substrate is subjected to several thin film processes to form the thin film transistor. The flexible substrate, having undergone the thin film processes, may be sealed by using an encapsulation layer. The flexible substrate, the thin film transistor formed on the flexible substrate, and the encapsulation layer form a display panel of the display device.

Generally, a cover window for protecting the display panel may be attached to a front surface of the display panel. A binder may be provided between the display panel and the cover window so the display panel may be bonded to the cover window.

Recently, a side-view display device including a primary display area for displaying a main image and a secondary display area for displaying a secondary image to a bent or curved side of the display panel has been under development.

The cover window and the bent or curved side may be manufactured in various shapes. However, the display panel and the cover window may not be properly bonded to each other.

SUMMARY

According to an exemplary embodiment of the present invention, an apparatus for manufacturing a display device includes a first jig including a first side, the first side having a concave groove for receiving a cover window, wherein the cover window includes a first planar portion, a first curved portion and a second curved portion, wherein the first and second curved portions are disposed at opposite ends of the first planar portion in a first direction, a second jig including a planar side for receiving a display panel, wherein when the second jig is moved in a second direction crossing the first direction with the display panel on the planar side, the display panel is disposed between the first and second curved portions of the cover window, and a pair of third jigs for supporting the first and second curved portions of the cover window.

According to an exemplary embodiment of the present invention, a method for manufacturing a display device includes bending opposite ends of a display panel in a first direction to curve the opposite ends, providing a cover window including a first planar portion and first curved portions disposed at opposite ends of the first planar portion in a first direction, moving the display panel in a second direction crossing the first direction to dispose the display panel between the first curved portions of the cover window, bonding the first planar portion of the cover window to the display panel, and pressurizing the opposite ends of the display panel in the first direction to bond the opposite ends of the display panel to the first curved portions of the cover window, respectively. The first direction and the second direction are substantially parallel to the first planar portion.

According to an exemplary embodiment of the present invention, an apparatus for manufacturing a display device includes a first support member having a first flat portion, a first concave portion disposed on a first side of the first flat portion and a second concave portion disposed on a second side of the first flat portion, wherein the first and second sides of the first flat portion face each other in a first direction, wherein the first and second concave portions extend in a second direction crossing the first direction, a second support member for supporting a cover window and a flexible display panel, wherein the second support member includes a second flat portion, a first convex portion disposed on a first side of the second flat portion and a second convex portion disposed on a second side of the second flat portion, wherein the first and second sides of the second flat portion face each other in the first direction, wherein the cover window has a third flat portion and a pair of third curved portions on opposite sides of the third flat portion, and a pair of third support members for supporting the first and second curved portions of the cover window. The second support member is disposed between the first support member and the pair of third support members, wherein the cover window and the flexible display panel are disposed between the second support member and the first support member, and between the second support member and the pair of third support members. The second support member is configured to move in a third direction crossing the first and second directions to attach a first portion of the flexible display panel to the third flat portion, and to move in the first direction and in a direction opposite to the first direction to attach a second portion of the flexible display panel to the pair of third curved portions.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
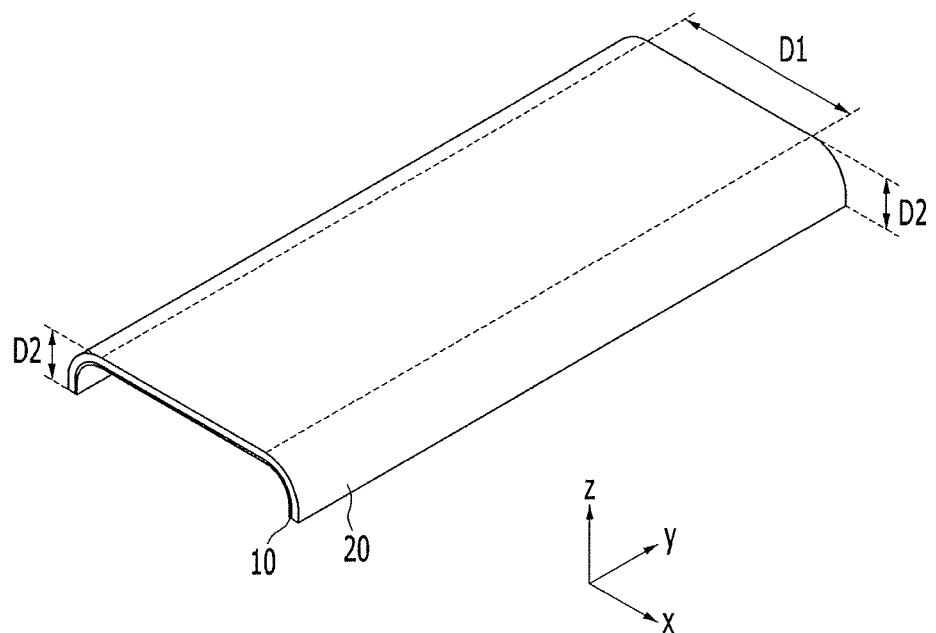
FIG. 1 illustrates a display device according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. The sizes or proportions of elements illustrated in the drawings may be exaggerated for clarity.

When an element is referred to as being 'on' another element, it can be directly on the other element, or intervening elements may be present therebetween.

A display device according to an exemplary embodiment of the present invention will now be described with reference to FIG. 1 to FIG. 4.

FIG. 1 illustrates a display device according to an exemplary embodiment of the present invention.

Referring to FIG. 1, a display device includes a display panel 10 for displaying an image and a cover window 20 for protecting the display panel 10.

The display panel 10 may include a touch panel and may be flexible. A driving circuit substrate including driving circuit components for transmitting signals for driving the display panel 10 and a battery for supplying power may be disposed on a rear side of the display panel 10. For example, a support structure for fixing the driving circuit substrate and the battery to the display panel 10 may be disposed on a lower portion of the display panel 10.

The cover window 20 may have a configuration in which at least one side portion D2 is bent, and the display panel 10 is bonded to the rear portion of the cover window 20 to display an image. The cover window 20 may include transparent glass or plastic, and may transmit the image displayed by the display panel 10 to the user.

The cover window 20 may have a configuration in which opposite side portions D2 are bent.

The cover window 20 may include a first planar portion D1, and side portions D2 at respective ends of the first planar portion D1 in a first direction (x). The first planar portion D1 of the cover window 20 may correspond to a region in which a primary image of the display panel 10 is displayed, and the side portions D2 of the cover window 20 may correspond to regions in which secondary images of the display panel 10 are displayed.

The shape of a side portions D2 of the cover window 20 may vary, and a detailed description thereof will be described with reference to FIG. 2 to FIG. 4.

Figure 2:
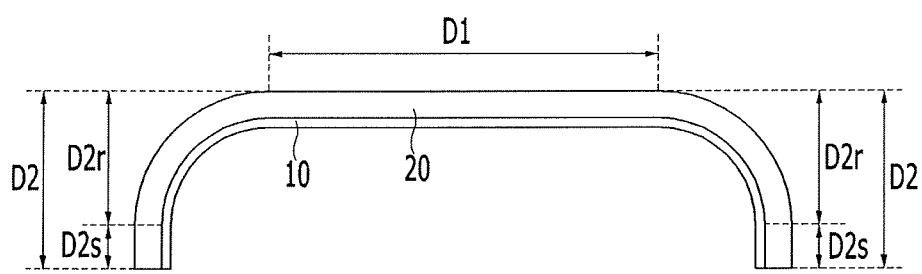
FIG. 2 illustrates a cover window included in a display device according to an exemplary embodiment of the present invention.
Figure 2:
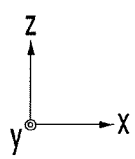

FIG. 2 illustrates a cover window included in a display device according to an exemplary embodiment of the present invention.

Referring to FIG. 2, the cover window 20 includes a first planar portion D1 and side portions D2 at respective ends of the first planar portion D1 in the first direction (x). The side portions D2 each include a curved portion (D2r) extending from the first planar portion D1 and a second planar portion (D2s) extending from the curved portion (D2r).

The second planar portion (D2s) may be perpendicular to the first planar portion D1, and a cross-section of the curved portion (D2r) may be a quarter circle. The curved portion (D2r) may have various values of a radius of curvature.

The flexible display panel 10 may have a shape including a first planar portion D1, a curved portion (D2r), and a second planar portion (D2s), according to the shape of the cover window 20. The flexible display panel 10 may be bonded to a rear portion of the cover window 20.

Figure 3:
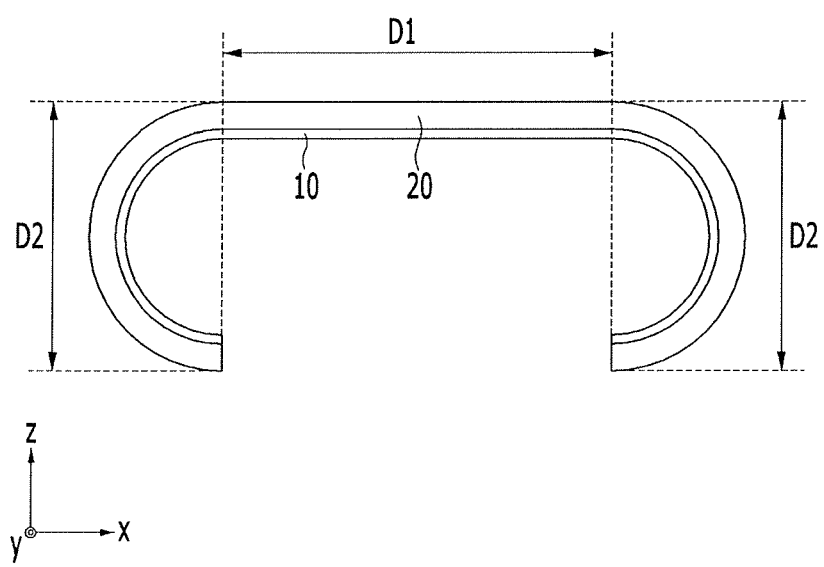
FIG. 3 illustrates a cover window included in a display device according to an exemplary embodiment of the present invention.

FIG. 3 illustrates a cover window included in a display device according to an exemplary embodiment of the present invention.

Referring to FIG. 3, the cover window 20 includes a first planar portion D1 and side portions D2 at respective ends of the first planar portion D1 in the first direction (x). The side portions D2 may be curved. A cross-section of the side portion D2 may be a half circle. A size of the radius of curvature of the side portion D2 may vary as needed.

The flexible display panel 10 may have a shape including a first planar portion D1 and a half-circle curved portion according to the shape of the cover window 20. The flexible display panel 10 may be bonded to a rear portion of the cover window 20.

Figure 4:
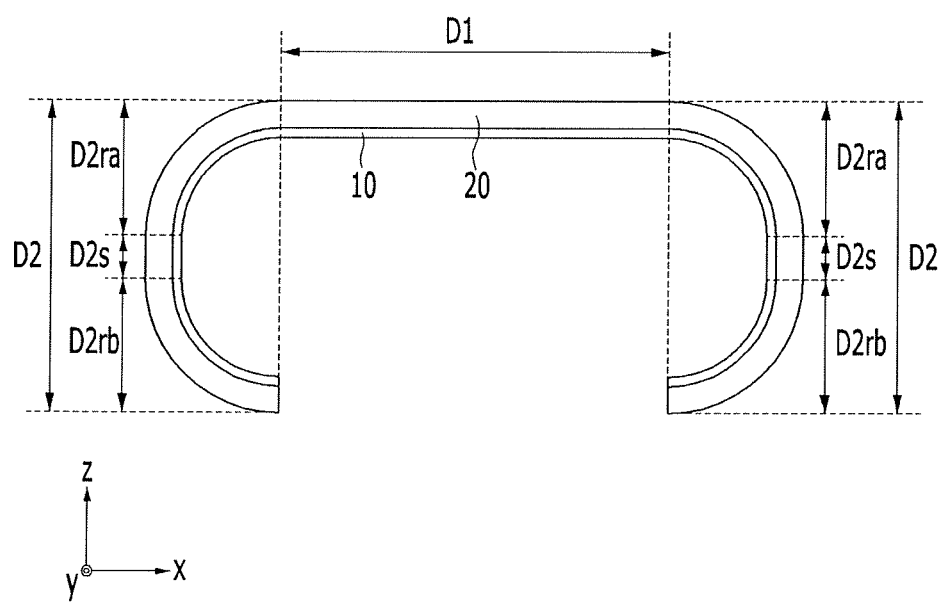
FIG. 4 illustrates a cover window included in a display device according to an exemplary embodiment of the present invention.

FIG. 4 illustrates a cover window included in a display device according to an exemplary embodiment of the present invention.

Referring to FIG. 4, the cover window 20 includes a first planar portion D1 and side portions D2 at respective ends of the first planar portion D1 in the first direction (x). Each of the side portions D2 includes a first curved portion (D2ra) extending from the first planar portion D1, a second planar portion (D2s) extending from the first curved portion (D2ra), and a second curved portion (D2rb) extending from the second planar portion (D2s).

A cross-section of the first curved portion (D2ra) may be a quarter circle, and the second planar portion (D2s) may be perpendicular to the first planar portion D1. A cross-section of the second curved portion (D2rb) may be a quarter circle. Sizes of the radii of curvature of the first curved portion (D2ra) and the second curved portion (D2rb) may vary as needed.

The flexible display panel 10 may have a shape including a first planar portion D1, a first curved portion (D2ra), a second planar portion (D2s), and a second curved portion (D2rb) according to the shape of the cover window 20. The flexible display panel 10 may be bonded to a rear portion of the cover window 20.

A display device, according to an exemplary embodiment of the present invention, will now be described with reference to FIG. 5 to FIG. 7.

Figure 5:
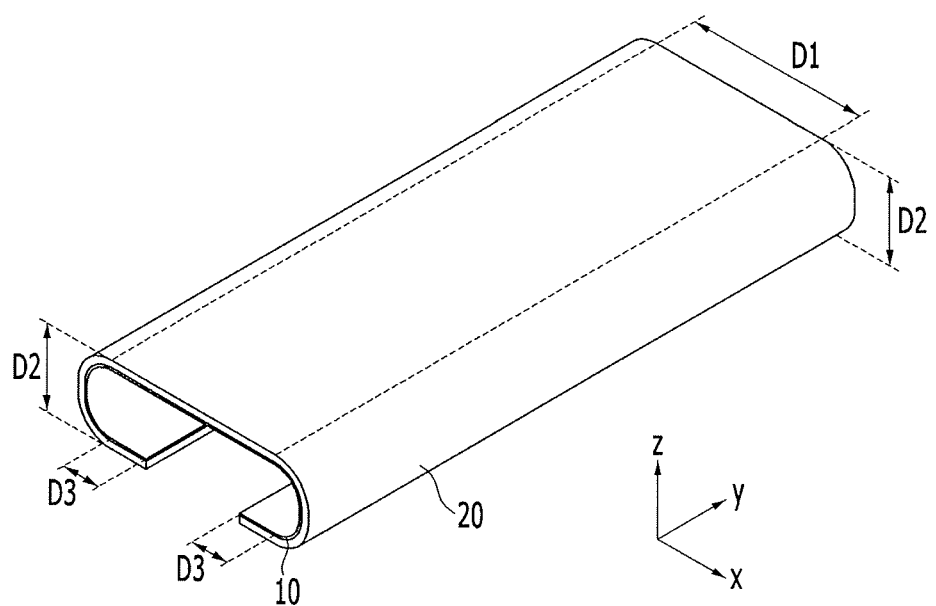
FIG. 5 illustrates a display device according to an exemplary embodiment of the present invention.

FIG. 5 illustrates a display device according to an exemplary embodiment of the present invention.

Referring to FIG. 5, the cover window 20 includes a first planar portion D1, side portions D2 at respective ends of the first planar portion D1 in the first direction (x), and third planar portions D3 extending from the side portions D2. The first planar portion D1 of the cover window 20 may correspond to a front of the display device for displaying a primary image of the display panel 10, the side portions D2 of the cover window 20 may correspond to sides of the display device for displaying a side-secondary image of the display panel 10, and the third planar portion D3 of the cover window 20 may correspond to a rear portion of the display device for displaying a rear-secondary image of the display panel 10.

Figure 6:
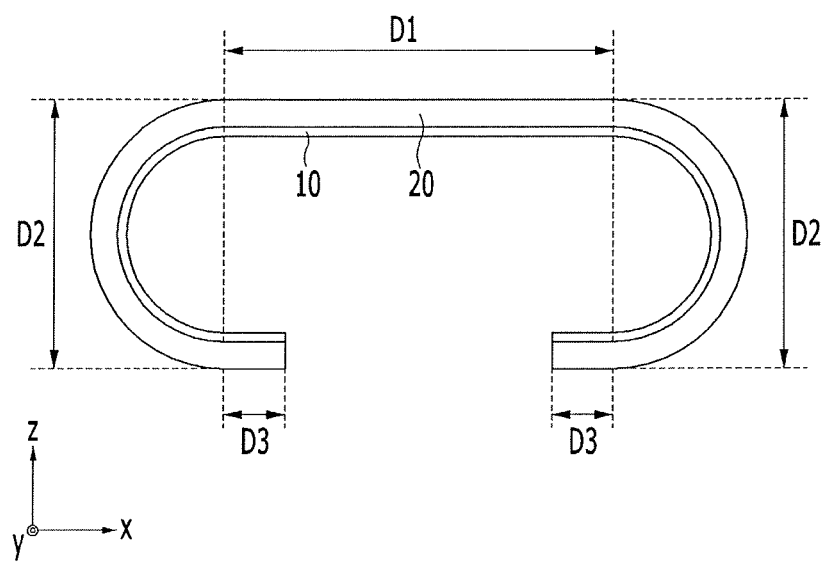
FIG. 6 illustrates a cover window included in a display device according to an exemplary embodiment of the present invention.

FIG. 6 illustrates a cover window included in a display device according to an exemplary embodiment of the present invention.

Referring to FIG. 6, the cover window 20 includes a first planar portion D1, side portions D2 at respective ends of the first planar portion D1 in the first direction (x), and third planar portions D3 extending from the side portions D2. The side portions D2 may be curved. A cross-section of the side portions D2 may be a half circle. In this case, the third planar portion D3 may be substantially parallel to the first planar portion D1. A size of the radius of curvature of the side portion D2 may vary as needed.

The flexible display panel 10 may have a shape including a first planar portion D1, a half-circle curved portion, and a third planar portion D3 according to the shape of the cover window 20. The flexible display panel 10 may be bonded to a rear portion of the cover window 20.

Figure 7:
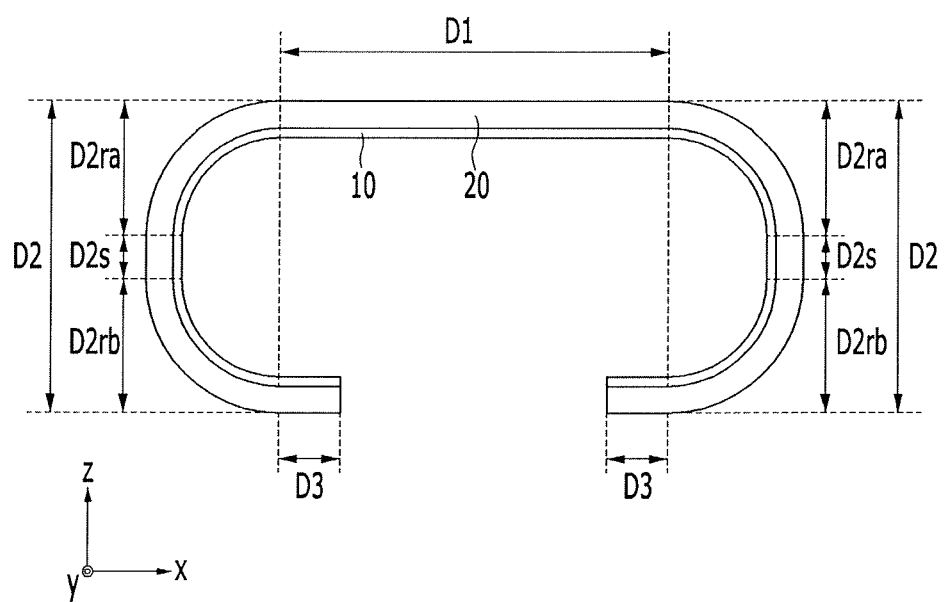
FIG. 7 illustrates a cover window included in a display device according to an exemplary embodiment of the present invention.

FIG. 7 illustrates a cover window included in a display device according to an exemplary embodiment of the present invention.

Referring to FIG. 7, the cover window 20 includes a first planar portion D1, side portions D2 at respective ends of the first planar portion D1 in the first direction (x), and third planar portions D3 extending from the side portions D2. Each of the side portion D2 includes a first curved portion (D2ra) extending from the first planar portion D1, a second planar portion (D2s) extending from the first curved portion (D2ra), and a second curved portion (D2rb) extending from the second planar portion (D2s).

A cross-section of the first curved portion (D2ra) may be a quarter circle, and the second planar portion (D2s) may be perpendicular to the first planar portion D1. A cross-section of the second curved portion (D2rb) may be a quarter circle, and the third planar portion D3 may be substantially parallel to the first planar portion D1 and substantially perpendicular to the second planar portion (D2s). Sizes of the radii of curvature of the first curved portion (D2ra) and the second curved portion (D2rb) may vary as needed.

An apparatus for manufacturing a display device for bonding a display panel 10 with a cover window 20 will now be described with reference to FIG. 8. A method for manufacturing a display device will be described with reference to FIG. 9 to FIG. 19.

For ease of description, the cover window 20 may include a first planar portion D1 and a side portion D2 as described with reference to FIG. 3, and the side portions D2 may be curved. In addition, the apparatus for manufacturing a display device and the manufacturing method of the display device may be used when the cover window 20 has a shape as shown in FIG. 2, 4, 6, or 7, or other shapes.

Figure 8:
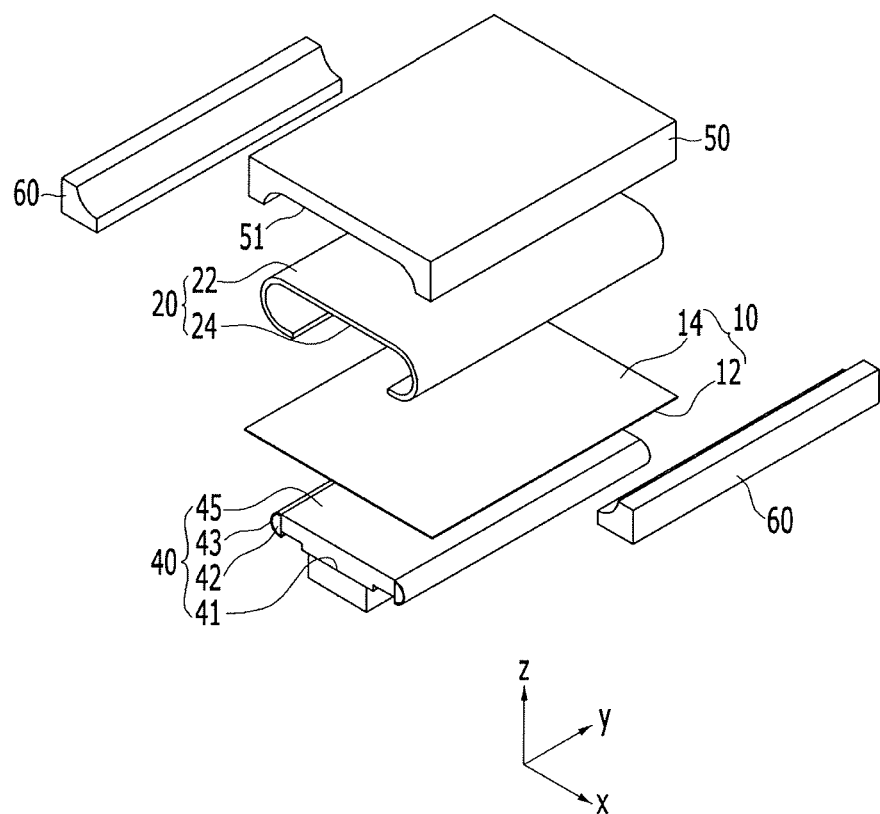
FIG. 8 illustrates an apparatus for manufacturing a display device according to an exemplary embodiment of the present invention.

FIG. 8 illustrates an apparatus for manufacturing a display device according to an exemplary embodiment of the present invention.

Referring to FIG. 8, an apparatus for manufacturing a display device includes a first jig, a second jig, and a third jig separated from each other and provided in different directions with respect to a molding target. The first jig may include an upper jig 50. The second jig may include a lower jig 40. The third jig may include side jigs 60. The lower jig 40, the upper jig 50, and the side jigs 60 may be disposed in a vacuum chamber.

The upper jig 50 includes a first arrival side 51 with a concave groove corresponding to a first side 22 of the cover window 20. The first arrival side 51 is combined with the first side 22 of the cover window 20. The first side 22 of the cover window 20 may be an upper side of the cover window 20. The cover window 20 arrives at the first arrival side 51 of the upper jig 50. A first part of the first arrival side 51 of the upper jig 50 may be planar and may contact the first planar portion D1 of the cover window 20, and a second part of the first arrival side 51 may be curved and may contact the curved portion of the cover window 20.

The lower jig 40 includes a body 41, a side portion 42, and a bumper 43.

The body 41 of the lower jig 40 includes a second arrival side 45 which contacts a first side 12 of the display panel 10. The first side 12 of the display panel 10 may be a lower side of the display panel 10. The second arrival side 45 of the lower jig 40 may be planar and may correspond to the first planar portion D1 of the cover window 20.

The side portion 42 of the lower jig 40 may have a convex curvature corresponding to the curved portion of the cover window 20. The radius of curvature of the side portion 42 may be equal to or less than the radius of curvature of the curved portion of the cover window 20. When the display panel 10 is disposed between the curved portion of the cover window 20 and the side portion 42, the radius of curvature of the side portion 42 of the lower jig 40 may be smaller than the radius of curvature of the curved portion of the cover window 20 so that the display panel 10 may not contact the cover window 20.

The bumper 43 of the lower jig 40 may be elastic and may surround the side portion 42. The bumper 43 may be used to disperse the pressure applied to the display panel 10 when the side portion 42 pressurizes the display panel 10.

The lower jig 40 may move horizontally in a second direction (y), crossing the first direction (x), to dispose the display panel 10 between the curved portions of the respective ends of the cover window 20. Further, the lower jig 40 move perpendicularly in a third direction (z), crossing the first and second directions (x) and (y), to bond a second side 14 of the display panel 10 to a second side 24 of the cover window 20. The second side 14 of the display panel 10 may be an upper side of the display panel, and the second side of the cover window 20 may be a lower side of the cover window 20. The side portion 42 of the lower jig 40 may protrude in the first direction (x) and in a direction opposite to the first direction (x) from the body 41 to bond the display panel 10 and the curved portions of the display 10 to the cover window 20. In addition, the lower jig 40 may repeatedly move in the first direction (x) and in a direction opposite to the first direction (x) to bond the display panel 10 and the curved portions of the display panel 10 to the cover window 20. The lower jig 40 may move in an opposite direction of the third direction (z) to bond the ends of the display panel 10 to the respective ends of the cover window 20.

The first direction (x), the second direction (y), and the third direction (z) may be orthogonal to each other. The first direction (x) and the second direction (y) may be parallel to the first planar portion of the cover window 20.

A binder (refer to 11 of FIG. 9 to FIG. 19) such as an optically clear adhesive (OCA) is disposed on the second side 14 of the display panel 10, and the second side 14 of the display panel 10 may be firmly bonded to the second side 24 of the cover window 20 by the binder 11.

The side jigs 60 support the curved portions of the respective ends of the cover window 20 after the cover window 20 contacts the upper jig 50. The side jigs 60 may be curved to accommodate/support the curved portions of the cover window 20.

The lower jig 40 has been described to move in the first direction (x), the second direction (y), and the third direction (z), and the upper jig 50 may also move in the first direction (x), the second direction (y), and the third direction (z).

At least one of the lower jig 40 and the upper jig 50 may be connected to a first driver, and the first driver may be disposed to move at least one of the lower jig 40 and the upper jig 50 in the first direction (x), the second direction (y), and the third direction (z). Further, the side jigs 60 may be connected to a second driver, and the side jigs 60 may move at least in the first direction (x) by the second driver. Each of the first and second drivers may include a pneumatic cylinder, a hydraulic pressure cylinder, or an electrical motor, and a detailed description thereof will be omitted for brevity.

Figure 9:
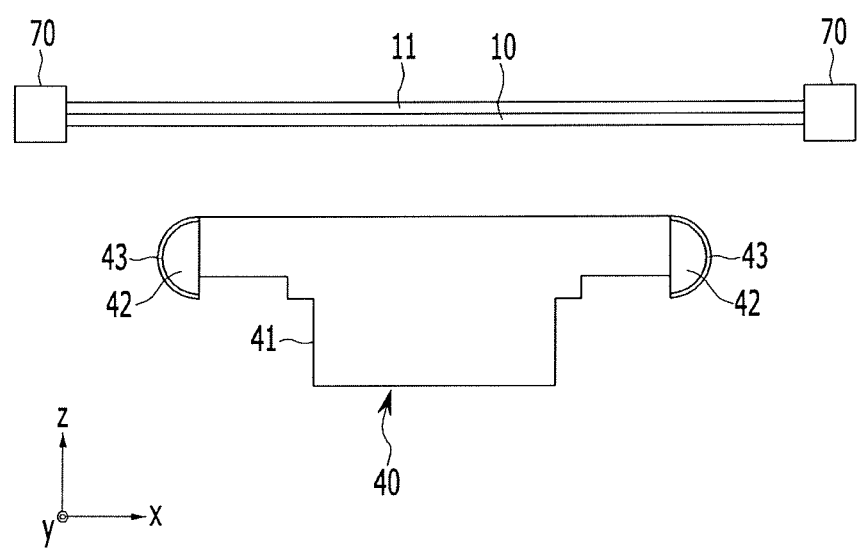
FIG. 9 illustrates loading a display panel in an apparatus for manufacturing a display device according to an exemplary embodiment of the present invention.
Figure 10:
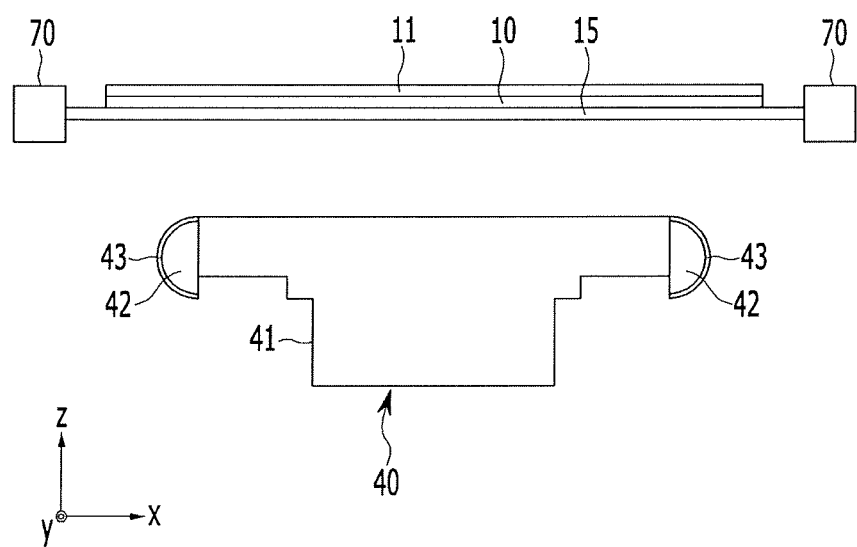
FIG. 10 illustrates loading a display panel in an apparatus for manufacturing a display device according to an exemplary embodiment of the present invention.

FIG. 9 illustrates loading a display panel in an apparatus for manufacturing a display device according to an exemplary embodiment of the present invention. FIG. 10 illustrates loading a display panel in an apparatus for manufacturing a display device according to an exemplary embodiment of the present invention.

Referring to FIG. 9, the binder 11 is disposed on the upper side of the display panel 10, and the display panel 10 is loaded on the lower jig 40. Respective ends of the display panel 10 in the first direction (x) may be fixed to a clamp 70 and be supported by the clamp 70.

Referring to FIG. 10, when the display panel 10 is fixed and supported by the clamp 70, a portion fixed to the clamp 70 may be damaged. To prevent the damage, the display panel 10 may be adhered on an adhesive film 15, and the adhesive film 15 may be fixed to the clamp 70 to be supported by the clamp 70. The adhesive film 15 may be separated and removed after the display panel 10 is bonded to the cover window 20.

For ease of description, the case (FIG. 9) of fixing the respective ends of the display panel 10 to the clamp 70 and supporting them will now be illustrated.

Figure 11:
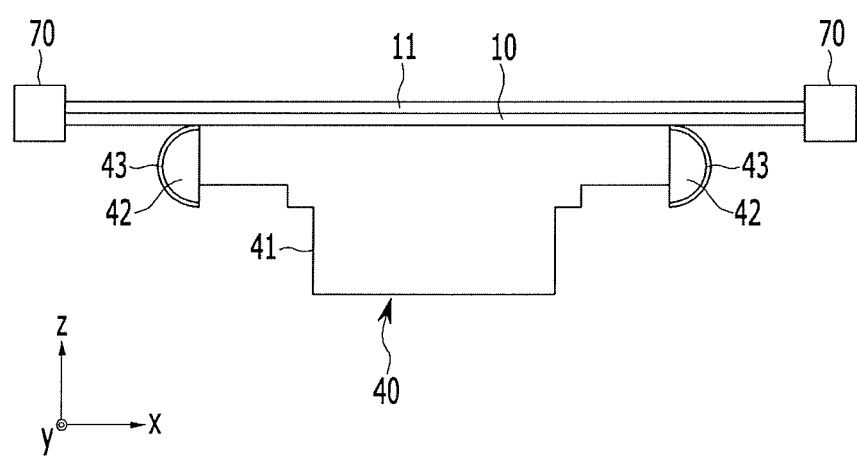
FIG. 11 illustrates a process for disposing a display panel onto an apparatus used in manufacturing a display device, according to an exemplary embodiment of the present invention.

FIG. 11 illustrates a process for disposing a display panel onto an apparatus used in manufacturing a display device, according to an exemplary embodiment of the present invention.

Referring to FIG. 11, the display panel 10 may be loaded on the lower jig 40 to contact the lower jig 40. The lower jig 40 may include an adhesive or may be vacuum-adsorbing to fix the display panel 10 thereon.

Figure 12:
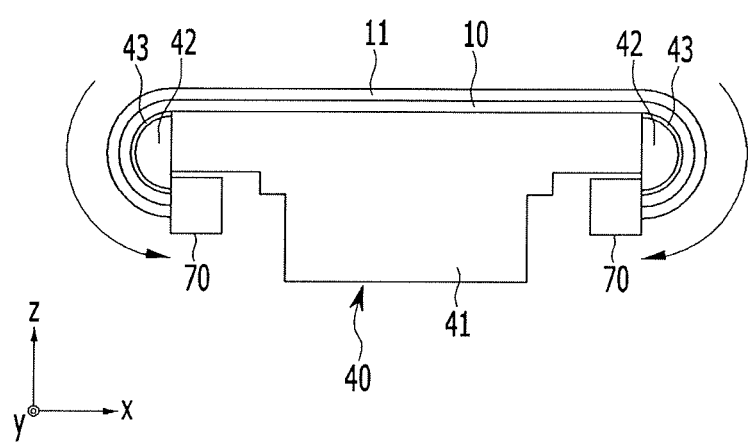
FIG. 12 illustrates a process for shaping a display panel by using an apparatus for manufacturing a display device, according to an exemplary embodiment of the present invention.

FIG. 12 illustrates a process for shaping a display panel by using an apparatus for manufacturing a display device, according to an exemplary embodiment of the present invention.

Referring to FIG. 12, when the display panel 10 is fixed to the lower jig 40, the respective ends of the display panel 10 in the first direction (x) are bent to be curved along the side portions 42 of the lower jig 40 by using the clamps 70. The curved ends of the display panel 10 may be fixed to the side portions 42 of the lower jig 40.

Figure 13:
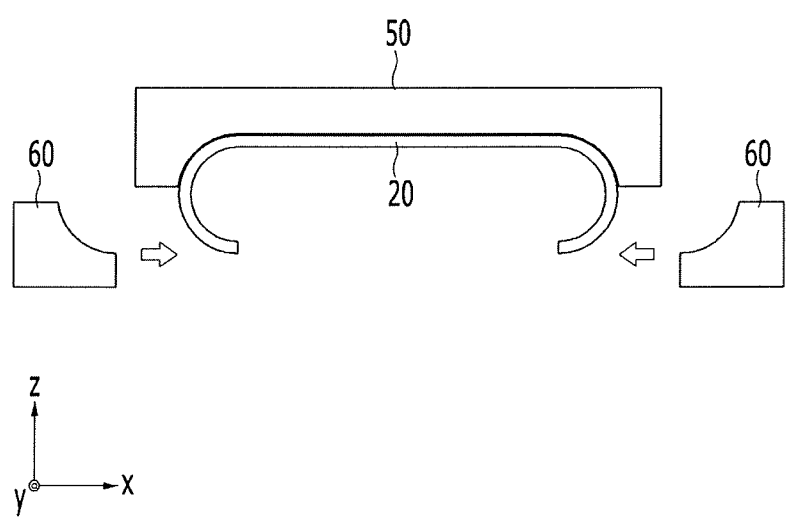
FIG. 13 illustrates a process of placing a cover window on an apparatus for manufacturing a display device, according to an exemplary embodiment of the present invention.

FIG. 13 illustrates a process of placing a cover window on an apparatus for manufacturing a display device, according to an exemplary embodiment of the present invention.

Referring to FIG. 13, the cover window 20 is disposed to contact the upper jig 50. The upper jig 50 may include an adhesive or may be vacuum-adsorbing to fix the cover window 20 thereon.

When the cover window 20 arrives at the upper jig 50, the side jigs 60 are separated from the upper jig 50. After the cover window 20 arrives at the upper jig 50, the side jigs 60 move toward the upper jig 50 and the curved portions of the cover window 20.

Figure 14:
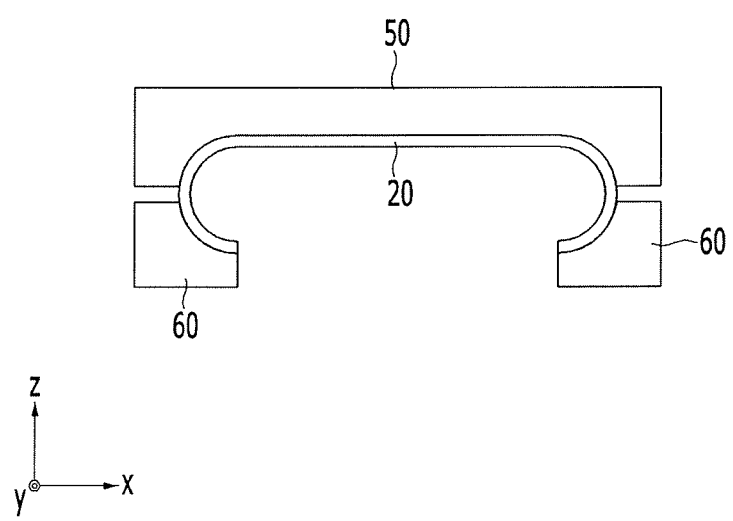
FIG. 14 illustrates a process of supporting a cover window in an apparatus for manufacturing a display device, according to an exemplary embodiment of the present invention.

FIG. 14 illustrates a process of supporting a cover window in an apparatus for manufacturing a display device, according to an exemplary embodiment of the present invention.

Referring to FIG. 14, the side jigs 60 have moved below the upper jig 50 and the curved portions of the cover window 20 support the cover window 20.

A preparation process for bonding the display panel 10 to the cover window 20 may be complete when the display panel 10 is placed and fixed to the lower jig 40 and the cover window 20 is placed and attached to the upper jig 50 with the side jigs 60 supporting the curved portions of the cover window 20.

Figure 15:
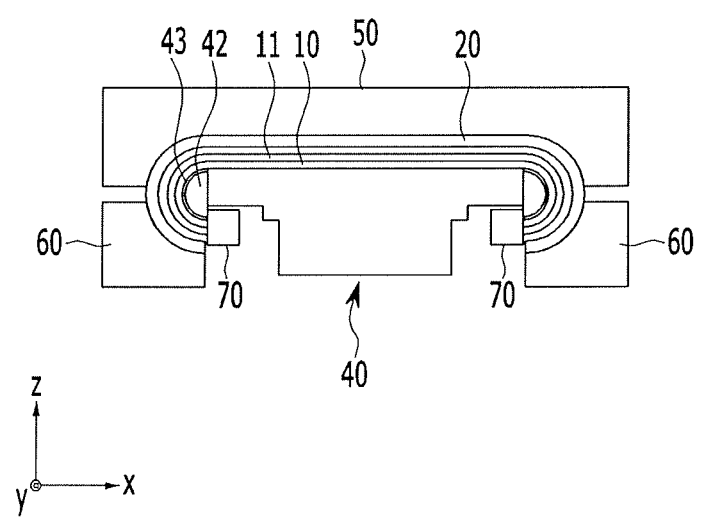
FIG. 15 illustrates a process for arranging a cover window and a display panel in an apparatus for manufacturing a display device, according to an exemplary embodiment of the present invention.

FIG. 15 illustrates a process for arranging a cover window and a display panel in an apparatus for manufacturing a display device, according to an exemplary embodiment of the present invention.

Referring to FIG. 15, after the display panel 10 is fixed to the lower jig 40 and the cover window 20 is fixed to the upper jig 50 and supported by the side jigs 60, the lower jig 40 horizontally moves in the second direction (y) to dispose the display panel 10 between the curved portions of the respective ends of the cover window 20. For example, the lower jig 40 slides into the space between the first planar portion D1 of the cover window 20 and the curved portions of the cover window 20.

In this case, the radius of curvature of the side portions 42 of the lower jig 40 may be less than the radius of curvature of the respective curved portions of the cover window 20 so the display panel 10 may not contact the cover window 20.

Accordingly, the display panel 10 and the cover window 20 face each other between the lower jig 40 and the upper jig 50.

Figure 16:
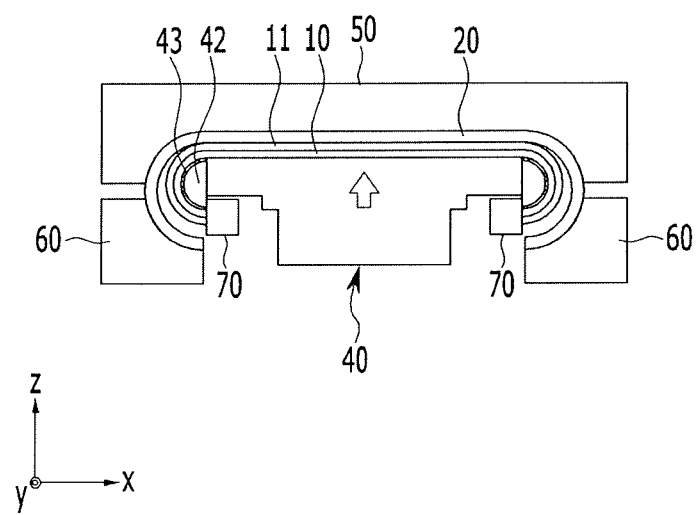
FIG. 16 illustrates a process for bonding a first planar portion of a cover window to a display panel in an apparatus for manufacturing a display device, according to an exemplary embodiment of the present invention.

FIG. 16 illustrates a process for bonding a first planar portion of a cover window to a display panel in an apparatus for manufacturing a display device, according to an exemplary embodiment of the present invention.

Referring to FIG. 16, after the display panel 10 faces the cover window 20, the lower jig 40 moves up in the third direction (z) so that the lower portion of the first planar portion D1 of the cover window 20 may be bonded to the upper portion of the display panel 10.

Figure 17:
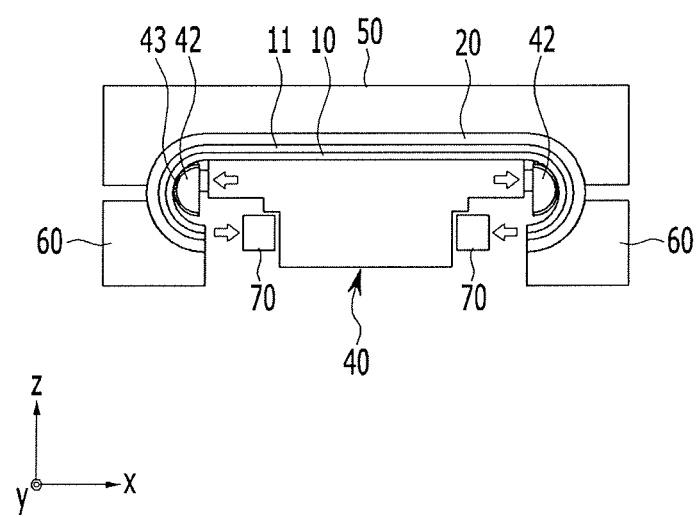
FIG. 17 illustrates a process for bonding a curved portion of a cover window to a display panel in an apparatus for manufacturing a display device, according to an exemplary embodiment of the present invention.

FIG. 17 illustrates a process for bonding a curved portion of a cover window to a display panel in an apparatus for manufacturing a display device, according to an exemplary embodiment of the present invention.

Referring to FIG. 17, after the lower portion of the first planar portion D1 of the cover window 20 is bonded to the upper portion of the display panel 10, the clamp 70, which fixes the ends of the display panel 10, is separated from the display panel 10. The side portions 43 of the lower jig 40 move toward the curved portions of the cover window 20, and the curved ends of the display panel 10 are pressurized onto respective curved portions of the cover window 20 to be bonded to the curved portions of the cover window 20.

In addition, the manufacturing device is configured so that the side portions 43 of the lower jig 40 do not move toward the curved portions of the cover window 20, when the lower jig 40 moves in the first direction (x) and in a direction opposite to the direction (x) to allow the lower jig 40 and the display panel 10 to be slid to overlap the cover window 20. Then the curved ends of the display panel 10 are pressurized onto respective curved portions of the cover window 20 by using the side portions 43 to bond the curved ends of the display panel 10 to the curved portions of the cover window 20.

Figure 18:
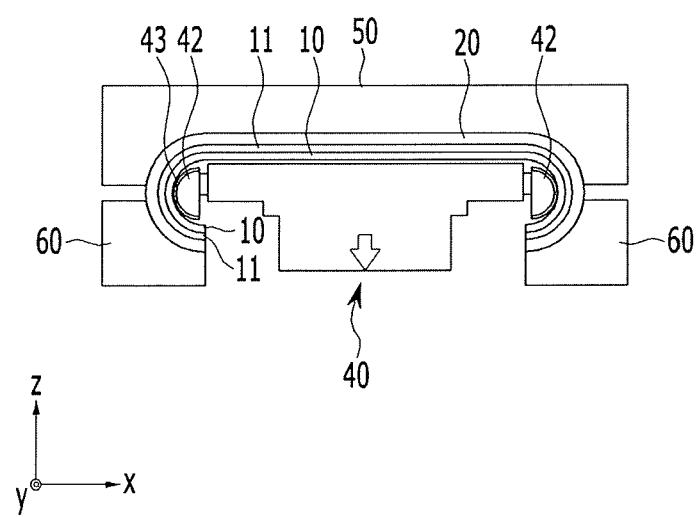
FIG. 18 illustrates a process for bonding a curved portion of a cover window to a display panel in an apparatus for manufacturing a display device, according to an exemplary embodiment of the present invention.

FIG. 18 illustrates a process for bonding a curved portion of a cover window to a display panel in an apparatus for manufacturing a display device, according to an exemplary embodiment of the present invention.

Referring to FIG. 18, the lower jig 40 goes down in a direction opposite to the third direction (z) to pressurize the curved ends of the display panel 10 on the respective curved ends of the cover window 20 to bond the curved ends of the display panel 10 to the respective curved ends of the cover window 70 According to an exemplary embodiment of the present invention, the process of moving the lower jig 40 in a direction opposite to the third direction (z) may be omitted.

When the cover window 20 includes a second planar portion D3 as shown in FIG. 6 and FIG. 7, pressurization and bonding of the display panel 10 with the second planar portion D3 of the cover window 20 may be efficiently performed by the process of moving the lower jig 40 in a direction opposite to the third direction (z).

In an apparatus for manufacturing a display device, a plurality of fourth jigs having various shapes may be used, in addition to the lower jig 40, to adhere the lower portion of the display panel 10 to the curved ends of the cover window 20. For example, a curved portion jig (refer to 90 of FIG. 19) may be used as the lower jig 40 for bonding the display panel 10 to the first planar portion of the cover window 20 and as the fourth jig for bonding the display panel 10 to the curved portion of the cover window 20. A case of the curved portion jig 90 will now be described with reference to FIG. 19.

Figure 19:
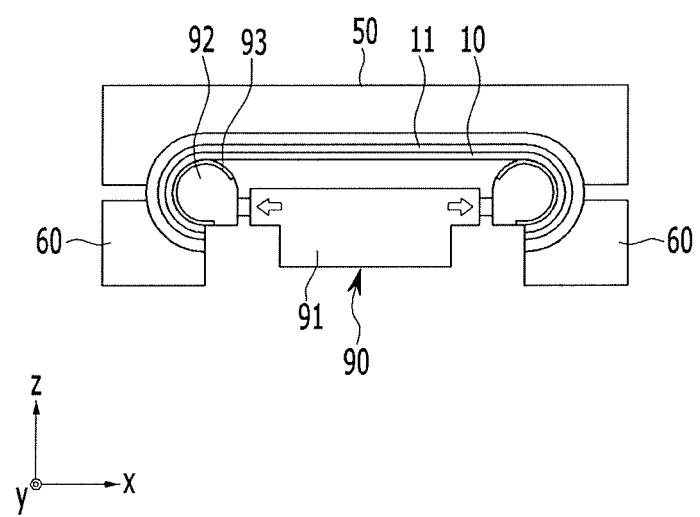
FIG. 19 illustrates a process for bonding a curved portion of a cover window to a display panel in a device for manufacturing a display device, according to an exemplary embodiment of the present invention.

FIG. 19 illustrates a process for bonding a curved portion of a cover window to a display panel in a device for manufacturing a display device, according to an exemplary embodiment of the present invention.

Referring to FIG. 19, after the process for bonding the display panel 10 to the first planar portion of the cover window 20 is performed by using of the lower jig 40 (refer to FIG. 16), the clamp 70 is separated from the respective ends of the display panel 10 and the lower jig 40 is separated from the display panel 10. In this case, the display panel 10 maintains remains bound to the lower portion of the cover window 20.

The curved portion jig 90 for bonding the respective ends of the display panel 10 and the respective ends of the cover window 20 horizontally moves in the second direction (y) and is inserted between the curved portions of the respective ends of the cover window 20. The cover window 20 and the display panel 10 are provided between the curved portion jig 90 and the upper jig 50.

The curved portion jig 90 includes a body 91, side portions 92, and bumpers 93. The side portions 92 of the curved portion lower jig 90 have a shape corresponding to the curved portions of the cover window 20. For example, the side portions 92 may have a radius of curvature corresponding to the radius of curvature of the curved portions of the cover window 20, or a radius of curvature slightly smaller than the radius of curvature of the curved portions of the cover window 20. A thickness of the body 91 of the curved portion jig 90 in the third direction (z) may be less than a thickness of the side portions 92 in the third direction (z). The body 91 does not contact the display panel 10. The bumpers 93 may be elastic and may surround the side portion 92. The side portions 92 may protrude from opposing sides of the body 91, and may pressurize the opposing curved ends of the display panel 10 to bond the curved ends of the cover window 20 to the respective curved ends of the display panel 10.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. An apparatus for manufacturing a display device, comprising:
    a first jig including a first side, the first side having a concave groove for receiving a cover window, wherein the cover window includes a first planar portion, a first curved portion and a second curved portion, wherein the first and second curved portions are disposed at opposite ends of the first planar portion in a first direction;
    a second jig including a planar side for receiving a display panel and provided to horizontally move in a second direction crossing the first direction, wherein when the second jig is moved in the second direction with the display panel on the planar side, the display panel is disposed between the first and second curved portions of the cover window; and
    a pair of third jigs for supporting the first and second curved portions of the cover window.

2. The apparatus of claim 1, wherein the second jig includes:
  a body including the planar side; and
  a first side portion and a second side portion disposed at opposite ends of the body in the first direction, wherein each of the first and second side portions is convex,
  wherein a radius of curvature of the first side portion is equal to or less than a radius of curvature of the first curved portion of the cover window, and a radius of curvature of the second side portion is equal to or less than a radius of curvature of the second curved portion of the cover window.

3. The apparatus of claim 2, wherein when the second jig is moved toward the first jig in a third direction that crosses the first direction and the second direction, the first planar portion of the cover window is bonded to the display panel.

4. The apparatus of claim 3, wherein the first side portion of the second jig protrudes away from the body in the first direction to bond the display panel to the first curved portion of the cover window, and the second side portion of the second jig protrudes away from the body in a direction opposite to the first direction to bond the display panel to the second curved portion of the cover window.

5. The apparatus of claim 3, wherein the second jig is movable in the first direction and in a direction opposite to the first direction to bond opposite ends of the display panel to opposite ends of the cover window, respectively.

6. The apparatus of claim 2, wherein the first side portion of the body includes a first elastic member; and the second side portion of the body includes a second elastic member.

7. The apparatus of claim 2, further comprising a first clamp for bending a first end of the display panel against the first side portion of the second jig and to fix the first end of the display panel to the first side portion of the second jig, and a second clamp for bending a second end of the display panel against the second side portion of the second jig and to fix the second end of the display panel to the second side portion of the second jig.

8. The apparatus of claim 1, further comprising a fourth jig that is movable in the second direction, and includes a side portion having a shape that corresponds to the first curved portion of the cover window.

9. An apparatus for manufacturing a display device, comprising:
  a first support member having a first flat portion, a first concave portion disposed on a first side of the first flat portion and a second concave portion disposed on a second side of the first flat portion, wherein the first and second sides of the first flat portion face each other in a first direction, wherein the first and second concave portions extend in a second direction crossing the first direction;
  a second support member for supporting a cover window and a flexible display panel, wherein the second support member includes a second flat portion, a first convex portion disposed on a first side of the second flat portion and a second convex portion disposed on a second side of the second flat portion, wherein the first and second sides of the second flat portion face each other in the first direction, wherein the cover window has a third flat portion and a pair of third curved portions on opposite sides of the third flat portion; and
  a pair of third support members for supporting the first and second curved portions of the cover window,
  wherein the second support member is disposed between the first support member and the pair of third support members, wherein the cover window and the flexible display panel are disposed between the second support member and the first support member, and between the second support member and the pair of third support members, and
  wherein the second support member is configured to move in a third direction crossing the first and second directions to attach a first portion of the flexible display panel to the third flat portion, and to move in the first direction and in a direction opposite to the first direction to attach a second portion of the flexible display panel to the pair of third curved portions.

* * * * *